United States Patent
Bowles et al.

(10) Patent No.: US 9,365,414 B2
(45) Date of Patent: Jun. 14, 2016

(54) SENSOR PACKAGE HAVING STACKED DIE

(71) Applicants: Philip H. Bowles, Gilbert, AZ (US); Stephen R. Hooper, Mesa, AZ (US)

(72) Inventors: Philip H. Bowles, Gilbert, AZ (US); Stephen R. Hooper, Mesa, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 50 days.

(21) Appl. No.: 14/257,553

(22) Filed: Apr. 21, 2014

(65) Prior Publication Data

US 2015/0298966 A1   Oct. 22, 2015

(51) Int. Cl.
*H01L 29/84* (2006.01)
*B81B 7/02* (2006.01)
*B81C 1/00* (2006.01)

(52) U.S. Cl.
CPC .............. *B81B 7/02* (2013.01); *B81C 1/0023* (2013.01); *B81B 2201/0235* (2013.01); *B81B 2201/0242* (2013.01); *B81B 2201/0292* (2013.01); *B81B 2207/07* (2013.01); *B81C 2203/0154* (2013.01); *B81C 2203/0792* (2013.01); *H01L 2224/05554* (2013.01); *H01L 2224/48091* (2013.01); *H01L 2224/48227* (2013.01); *H01L 2224/49171* (2013.01); *H01L 2224/73265* (2013.01); *H01L 2924/181* (2013.01)

(58) Field of Classification Search
USPC .............. 257/E25.031–E25.032, E23.042, 257/678–733, 787–796, E23.001–E23.194, 257/E21.499–E21.519, 777, 685, 686, 723, 257/726
See application file for complete search history.

(56) References Cited

U.S. PATENT DOCUMENTS

| | | | |
|---|---|---|---|
| 7,605,476 B2 | 10/2009 | Gritti | |
| 2003/0029920 A1* | 2/2003 | Chhor et al. | 235/492 |
| 2004/0142505 A1* | 7/2004 | Huang et al. | 438/106 |
| 2007/0126130 A1* | 6/2007 | Dehe et al. | 257/787 |
| 2007/0284715 A1* | 12/2007 | Li et al. | 257/686 |
| 2009/0051043 A1 | 2/2009 | Wong et al. | |
| 2009/0218668 A1* | 9/2009 | Zhe et al. | 257/680 |
| 2010/0084761 A1* | 4/2010 | Shinagawa | 257/706 |
| 2010/0284553 A1* | 11/2010 | Conti et al. | 381/174 |
| 2011/0108971 A1* | 5/2011 | Ewe et al. | 257/686 |
| 2012/0061813 A1* | 3/2012 | Ho et al. | 257/676 |
| 2013/0015589 A1 | 1/2013 | Liao et al. | |
| 2013/0134604 A1* | 5/2013 | Sutanto et al. | 257/777 |
| 2013/0184567 A1* | 7/2013 | Xie et al. | 600/424 |
| 2013/0285260 A1* | 10/2013 | Denison et al. | 257/777 |
| 2014/0048946 A1* | 2/2014 | Bowles et al. | 257/774 |
| 2014/0054798 A1* | 2/2014 | Bowles | 257/777 |
| 2014/0061884 A1* | 3/2014 | Carpenter et al. | 257/676 |
| 2014/0070382 A1* | 3/2014 | Goida | 257/666 |
| 2014/0197527 A1* | 7/2014 | Mengel et al. | 257/676 |
| 2014/0320147 A1* | 10/2014 | Scherr et al. | 324/511 |

* cited by examiner

*Primary Examiner* — Dao H Nguyen
*Assistant Examiner* — Tram H Nguyen (57) ABSTRACT

A small area semiconductor device package containing two or more MEMS sensor device die and a controller die for the sensor devices is provided. The controller die is mounted on top of the largest MEMS sensor device die (e.g., a gyroscope) and over a second MEMS sensor device die (e.g., an accelerometer). In one embodiment, the controller die is also mounted on the top of the second MEMS sensor device die. In another embodiment, the controller die overhangs the second MEMS sensor device die, which is of a lesser thickness than the first MEMS sensor device die.

20 Claims, 4 Drawing Sheets

SENSOR PACKAGE HAVING STACKED DIE

BACKGROUND

1. Field

This disclosure relates generally to semiconductor device packaging, and more specifically, to providing a multiple microelectromechanical systems sensor package having an incorporated application specific integrated circuit in a minimum area.

2. Related Art

Consumer products incorporating semiconductor devices continue to include greater amounts of functionality in smaller and smaller packages. Many consumer products, such as smart phones, digital cameras, game console controllers, and the like, incorporate microelectromechanical systems (MEMS) devices, such as gyroscopes for detecting angular orientation, accelerometers, and magnetometers. The size constraints in consumer products, and the like, dictate that sensor devices and their controller chips take up less and less area.

One historical solution provides for multiple sensors in a single package. For example, a package can include a gyroscope and an accelerometer, or also include a magnetometer, along with an application specific integrated circuit (ASIC) to process signals from the sensors. In order to accommodate the multiple sensors in a package of a size appropriate to an application, the sensors can be arranged next to one another in the package. But current area constraints are such that the sensors themselves are reduced in size. Including an ASIC to monitor the sensors in the package has involved mounting the ASIC on one of the sensor die. But reduced sizes of the sensor die result in an ASIC with a larger area than any single sensor in the package.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a small area semiconductor device package containing two or more MEMS sensor device die and a controller die for the sensor devices. The controller die is mounted on top of the largest MEMS sensor device die (e.g., a gyroscope) and over a second MEMS sensor device die (e.g., an accelerometer). In one embodiment, the controller die is also mounted on the top of the second MEMS sensor device die. In another embodiment, the controller die overhangs the second MEMS sensor device die, which is of a lesser thickness than the first MEMS sensor device die.

Overall floor plan area and package thickness are two major concerns related to sensor packages for current products incorporating semiconductor devices. Product manufacturers continue to require reduced areas and thicknesses of sensor packages. In order to satisfy this size constraint, MEMS sensor device die have been reduced in size. This size reduction, however, results in difficulties in providing not only the MEMS sensor device die in the package, but also the controller die for the various sensors.

The controller die is typically an ASIC that is mounted on one of the die in the package. But for small MEMS sensor device die, there is insufficient area to mount the controller die completely on a major surface of one of the MEMS devices and still be able to provide the functionality required of the controller die. Embodiments of the present invention address this problem by having the controller die mounted on a first of the MEMS sensor device die and overhang a second of the MEMS sensor device die. In some embodiments, the second MEMS sensor device die is the same thickness as the first MEMS sensor device die, and therefore the controller die can be attached to both the MEMS sensor device die.

In the configuration in which the controller is physically coupled to both the sensor device die, the controller die bridges a space between the two sensor device die. Depending on physical properties of a mold material used in encapsulating the package, there may be issues with the quality of the mold material between the sensor device die and under the bridging controller die. For example, although the molding material is drawn in to the space between the die by virtue of using vacuum molding techniques, that molding material may be higher in resin content and lower in silica or other compounds. This can affect the quality of the encapsulant in that region after curing. Differences in encapsulant quality can affect thermal performance of the encapsulant and consequently the various die in that region.

In order to avoid such issues related to molding material variations, another configuration can have the controller die affixed to a thicker of the two MEMS sensor device die, and overhanging the second of the two MEMS sensor device die. This configuration provides a cantilevered portion of the controller die having a gap between a bottom surface of the controller die and the top surface of the second MEMS sensor device die. This gap can allow molding material to flow more readily into the gap between the sensor device die, and therefore improve quality of the resulting encapsulant after curing. One concern with such a configuration can be additional stresses in the cantilevered controller die. Such stresses can be generated during normal operations due to temperature changes in the package. Stresses can also occur during manufacturing, such as when wire bonding is performed on contacts provided in the cantilevered region of the controller die.

The appropriate configuration for a particular package can be dependent upon a number of factors related to the performance and stress considerations. For example, if the processing techniques provided by a selected fabrication facility are such that pressure is exerted during wire bonding (e.g., copper wire bonding) is high enough to break the adhesive coupling between the controller die and the first MEMS sensor device die when performed over the cantilevered region, then that may suggest use of the bridging configuration. In another example, if the material used as an encapsulant at another fabrication facility results in material differences in the gap region beneath the controller die bridge, then that may suggest use of the cantilevered configuration. Other factors may go into such a choice, depending upon the application being addressed. For example, if the controller die has an overhang that is beyond the tolerances for wire bonding allowed by the fabrication facility, that may suggest use of the bridging configuration.

Figure 1:
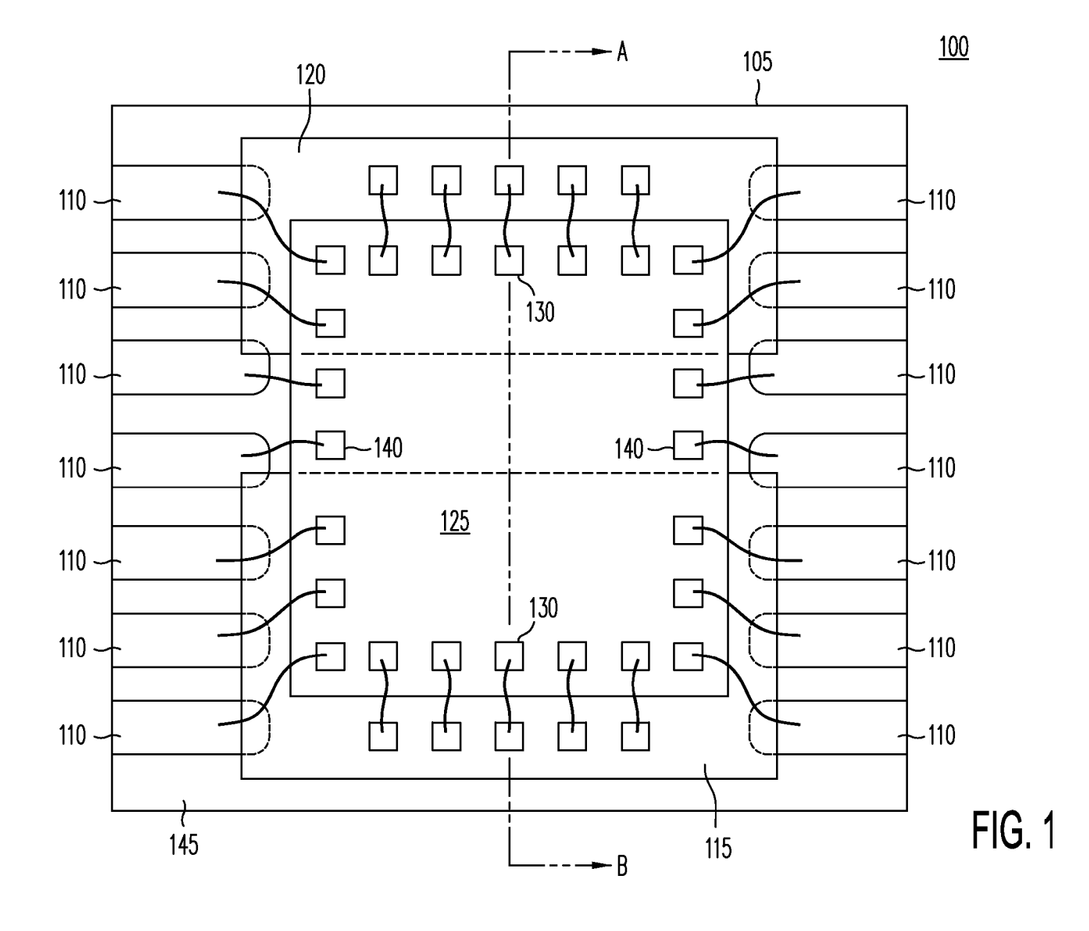
FIG. 1 is a simplified block diagram illustrating a plan view of a semiconductor device package incorporating MEMS sensor die and a controller die, in accord with embodiments of the present invention.

FIG. 1 is a simplified block diagram illustrating a plan view of a semiconductor device package 100 incorporating MEMS sensor die and a controller die, in accord with embodiments of the present invention. Semiconductor device package 100 includes a lead frame that provides leads 110 along the perimeter of the package and extending toward the middle of the package. As illustrated, semiconductor device package 100 is a dual flat no-leads (DFN) package. But embodiments of the present invention are not limited to DFN packages or packages without a flag and can provide leads in a variety of configurations according to the needs of the application and available area.

Two device die are provided in the package. Functionally, the two device die are envisioned as MEMS sensor device die, but embodiments of the present invention are not limited to MEMS devices. A first MEMS device die 115 and a second MEMS device die are provided and sit on a portion of leads 110 located toward the middle of the package (a "Chip On Lead" (COL) configuration). As illustrated first MEMS device die 115 is the same width as MEMS device die 120, but MEMS device die 115 is longer than MEMS device die 120, and embodiments are not limited to device die of the same width. The two MEMS device die are arranged next to one another, forming a gap between them. A controller die 125 is provided in a stacked configuration above the two MEMS device die. As will be discussed further below, controller die 125 is mechanically coupled to at least the top major surface of MEMS device die 115 and can be mechanically coupled to the top major surface of MEMS device die 120.

Controller die 125 includes sets of electrical contacts 130, 135, and 140 on the major surface of the controller die opposite the major surface in contact with MEMS device die 115. Electrical contacts 130 are electrically coupled to electrical contacts provided on an exposed portion of the top surface of MEMS device die 115 by one or more wire bonds. Electrical contacts 135 are electrically coupled to electrical contacts provided on an exposed portion of the top surface of MEMS device die 120 by one or more wire bonds. Electrical contacts 140 are electrically coupled to one or more package leads 110 provided by the lead frame, using wire bonds.

As discussed above, selection of the type of MEMS device die is dependent upon the application for the package. In one embodiment, MEMS device die 115 is a gyroscope, while MEMS device die 120 is an accelerometer. Additional MEMS device die can be included in the package. For example, a magnetometer die can be mounted on top of controller die 125 and electrically coupled to the controller die, for example, through the use of wire bonds to contacts on the top major surface of the controller die. It should be noted that the different operational parameters for a gyroscope and an accelerometer prevent combining the two sensor devices in a single die.

Figure 2:
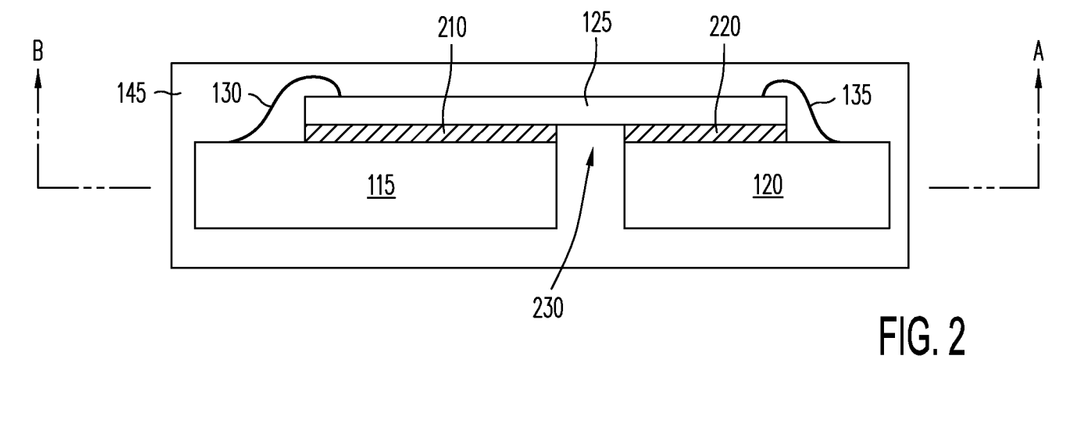
FIG. 2 is a simplified block diagram illustrating a cross section through a plane A-B of one embodiment of the semiconductor device package, in accord with embodiments of the present invention.

FIG. 2 is a simplified block diagram illustrating a cross section through a plane A-B of one embodiment of semiconductor device package 100, in accord with embodiments of the present invention. MEMS device die 115 and 120 are mounted next to one another in the package, as also shown in the plan view of FIG. 1. Since the cross section plane does not lie along the lead frame leads, no leads are shown in FIG. 2. Controller die 125 is mounted on top of the two MEMS device die. Controller die 125 is adhesively coupled to MEMS device die 115 and 120 through use of adhesive layers 210 and 220 respectively. In order to accommodate mounting on both MEMS device die, the MEMS device die are constructed to be the same thickness. Wire bonds 130 and 135, electrically coupling controller die 125 to contacts on MEMS device die 115 and 120 respectively, are illustrated. Encapsulant 145 is illustrated as being formed over and around each die within the package and in the region 230 beneath controller die 125.

A molding material is applied to the MEMS device die, controller die, and wire bonds illustrated in FIG. 2, forming encapsulant 145 that encapsulates the structures within the molding material and forms a panel prior to a singulation process that provides semiconductor device package 100. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding and spin application. In order to fill region 230 with molding material, vacuum molding techniques may be used to draw the molding material into the region Once the molding material is applied, the panel can be cured by exposing the materials to certain temperatures for a period of time, or by applying curing agents, or both. In a typical encapsulation process, a depth of encapsulant 145 exceeds a maximum height of structures embedded in the molding material (e.g., the height of wire bonds 130 and 135 as illustrated in FIG. 2).

One concern with the configuration of FIG. 2 is that the composition of the molding material in region 230 may not be the same as that of the remainder of semiconductor device package 100. This may occur due to molding material being drawn into the space through small gaps by a vacuum molding process. Fewer filler particles in a plastic encapsulation resin, for example, may be able to pass into region 230. This can result in region 230 being resin rich, and thus the formed encapsulant having differing thermal properties from the rest of the package. In addition, if the egress points for the molding material are not of sufficient size to allow the molding material to flow into region 230, gaps or voids may form in the resulting encapsulant. Such gaps can affect the thermal performance of the encapsulant and cause potential hot points and separation regions in semiconductor device package 100.

Figure 3:
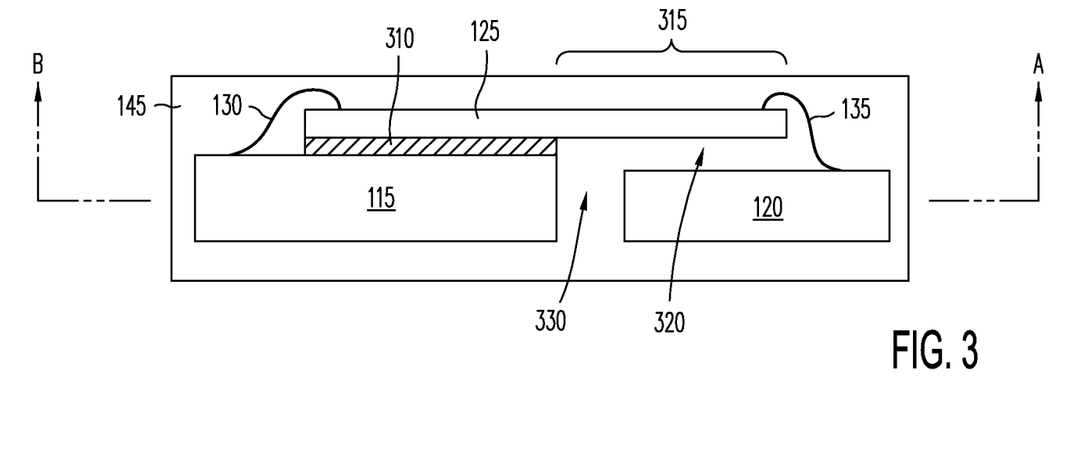
FIG. 3 is a simplified block diagram illustrating a cross section through a plane A-B of one embodiment of the semiconductor device package, in accord with embodiments of the present invention.

FIG. 3 is a simplified block diagram illustrating a cross section through a plane A-B of another embodiment of semiconductor device package 100, in accord with embodiments of the present invention. As in FIGS. 1 and 2, MEMS device die 115 and 120 are mounted next to one another in the package. Since the cross section plane does not lie along the lead frame leads, no leads are shown in FIG. 3, but the die are illustrated as elevated above the bottom surface of the encapsulated volume because the die sit on the leads, as discussed above. Controller die 125 is mounted on top of MEMS device die 115 and overhangs MEMS device die 120. The controller die is adhesively coupled to MEMS device die 115 through use of an adhesive layer 310. As illustrated, MEMS device die 115 is thicker than MEMS device die 120. This results in a gap region 320 between MEMS device die 120 and controller die 125 in the overhang area. In addition, a region 330 results beneath controller die 125 and between MEMS device die 115 and 120. Wire bonds 130 and 135, electrically coupling controller die 125 to contacts on MEMS device die 115 and 120 respectively, are illustrated.

As with FIG. 2, a molding material is applied to the MEMS device die, controller die, and wire bonds illustrated in FIG. 3, forming encapsulant 145 that encapsulates the structures within the molding material and forms a panel prior to a singulation process that provides semiconductor device package 100. Vacuum molding techniques can be used to draw the molding material into regions 320 and 330. Once the molding material is applied, the panel can be cured by exposing the materials to certain temperatures for a period of time, or by applying curing agents, or both.

The overhang configuration of the embodiment illustrated in FIG. 3 can resolve the molding material composition consistency issues presented by the embodiment in FIG. 2. Gap region 320 permits molding material to more readily enter region 330 during vacuum molding. Further, larger filler particles can enter both gap region 320 and region 330, thereby allowing for greater material consistency in the cured encapsulant.

Certain processability concerns may be present in cantilevered configurations such as that illustrated in FIG. 3. For example, if overhang distance 315 is too great, adhesive layer 310 may not be able withstand forces applied by wire bonding techniques to form wire bond 135 and other wire bonds at the end of the cantilevered section. This can be particularly true for standard copper wire bonding techniques, which generally use higher pressures than those used for gold wire bonding. In addition, the controller die may crack in response to wire bonding, if the controller die is too thin. Low pressure wire bonding techniques may be required to successfully form wire bond 135. But such wire bonds may not have sufficient reliability for certain applications. Further, differing coefficients of expansion between the MEMS device die, controller die, and encapsulant can generate greater stresses in the semiconductor device package illustrated in FIG. 3 over that of FIG. 2. Processability, reliability, and stress considerations can be taken into account in determining which configuration is suitable for a particular application. In one embodiment, approximately 60% of the controller die is adhesively coupled to the underlying MEMS device die 115.

FIGS. 4-7 illustrate example steps taken in the process of forming the embodiment illustrated in FIG. 3.

Figure 4:
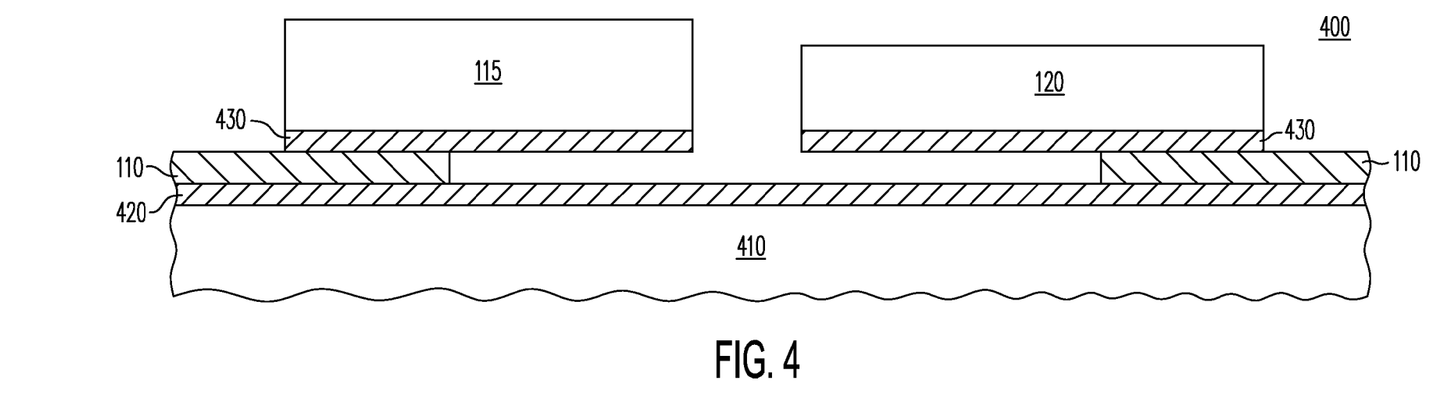
FIGS. 4-7 illustrate example steps taken in the process of forming the embodiment illustrated in FIG. 3.

FIG. 4 is a simplified block diagram illustrating a cross-sectional view of a device structure 400 at a stage in one example of processing, according to an embodiment of the present invention. A lead frame that provides leads 110 is placed on an adhesive layer 420 on a carrier 410. Adhesive layer 420 can be of a standard type used in semiconductor packaging processing including, for example, a double-sided polyimide sticky tape having a silicone adhesive on both sides. The adhesive layer should be of the type that can withstand packaging processing without becoming brittle or permanently fixed in place, since at a later point in processing the tape will be separated from the package. MEMS device die 115 and 120 are placed on a portion of leads 110 that is toward a middle of the package. Typically for COL/DFN packages, an adhesive layer 430 is applied to a die wafer prior to dicing, and so the adhesive layer is present on the leadframe side of the die when placed on the leadframe. An active side of MEMS device die 115 and 120 (the side having bond pads for later electrical coupling) is opposite the side placed on leads 110. MEMS device die 115 and 120 are placed within regions of the lead frame to be contained within a single package.

MEMS device die 115 and 120 provide MEMS components suggested by the application for the resulting semiconductor device package. In one embodiment, MEMS device die 115 is a gyroscope device, while MEMS device die 120 is an accelerometer. But embodiments of the present invention are not limited to the type of MEMS device die. As illustrated for the embodiment provided in FIG. 3, MEMS device die 115 is thicker than MEMS device die 120. This provides for fewer constraints in the choice of MEMS device die components, as the MEMS device die are not required to be of the same thickness. In order to provide a thinner MEMS device die 120, MEMS device die 120 can be manufactured to a lesser thickness than that of MEMS device die 115 or MEMS device die can be mechanically reduced in thickness through back grinding process or the like.

In one embodiment, the resulting semiconductor device package is approximately 3 mm×3 mm×0.8 mm. To provide such small footprint area, MEMS device die 120 is approximately 2.2 mm×0.8 mm×0.25 mm and MEMS device die 115 is approximately 2.2 mm×1.5 mm×0.3 mm. Thus, the region between the two MEMS device die can be approximately 0.5 mm or less.

Figure 5:
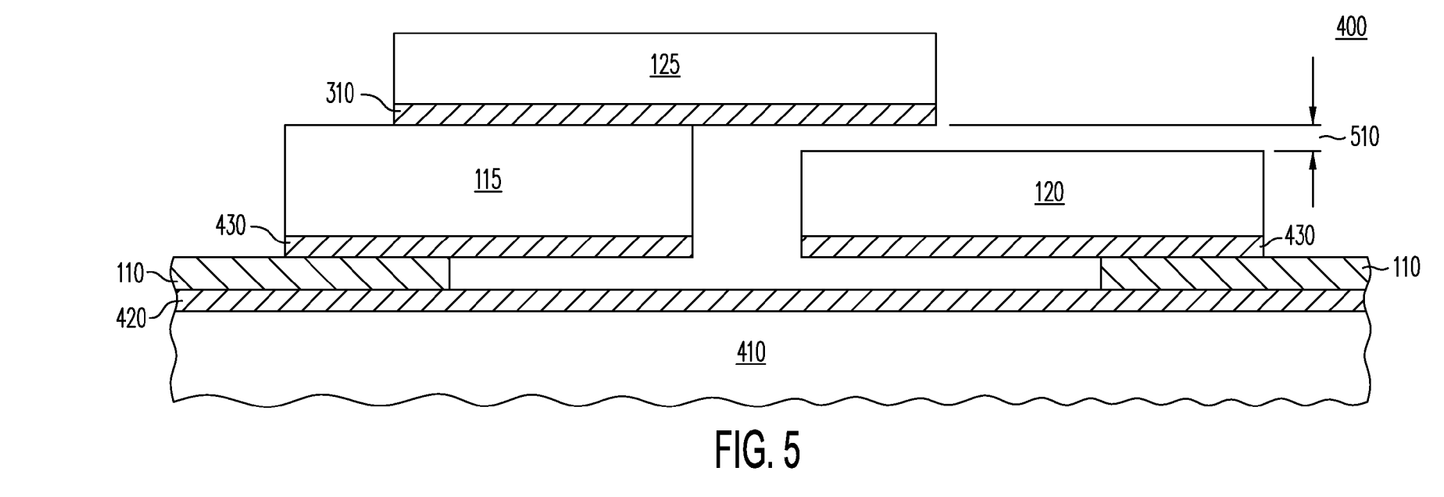

FIG. 5 is a simplified block diagram illustrating the cross-sectional view of device structure 400 at a later stage in the processing example. Controller die 125 is adhesively attached to a portion of the top major surface of MEMS device die 115, using an adhesive layer 310. As discussed above, adhesive layer 310 can be applied to a die wafer that includes controller die 125 prior to dicing. Alternatively, adhesive layer 310 can be applied to a portion of the top surface of MEMS device die 115 prior to placing controller die 125. Controller die 125 is attached to the MEMS device die in a region of the top surface that does not contain contact pads, thus freeing the active surface of the MEMS device die. Adhesive layer 310 can be a variety of materials, including but not limited to a die attach film or a screen-printed epoxy. As will be discussed more fully below, the mechanical properties of adhesive layer 210, in the cantilevered configuration illustrated, should be sufficient to maintain the adhesive coupling during wire bonding of contact pads along the periphery of the cantilevered section of controller die 125. Controller die 125 extends over MEMS device die 120 and the gap region between the two MEMS device die. Distance 510, in the example discussed above, is on the order of 0.05 mm.

Controller die 125 can take a variety of configurations depending upon the application for the semiconductor device package. In one configuration, controller die 125 is an application specific integrated circuit (ASIC) that provides circuitry for receiving and analyzing signals from the MEMS device die that the ASIC controls. In the example illustrated, controller die 125 can provide control circuitry for the two MEMS device die. In another example (not illustrated), a third MEMS device die can be mounted on top of controller die 125. The active surface of controller die 125 is the free major surface (e.g., the top surface as illustrated) and can provide sets of contact pads, as illustrated in FIG. 1.

Figure 6:
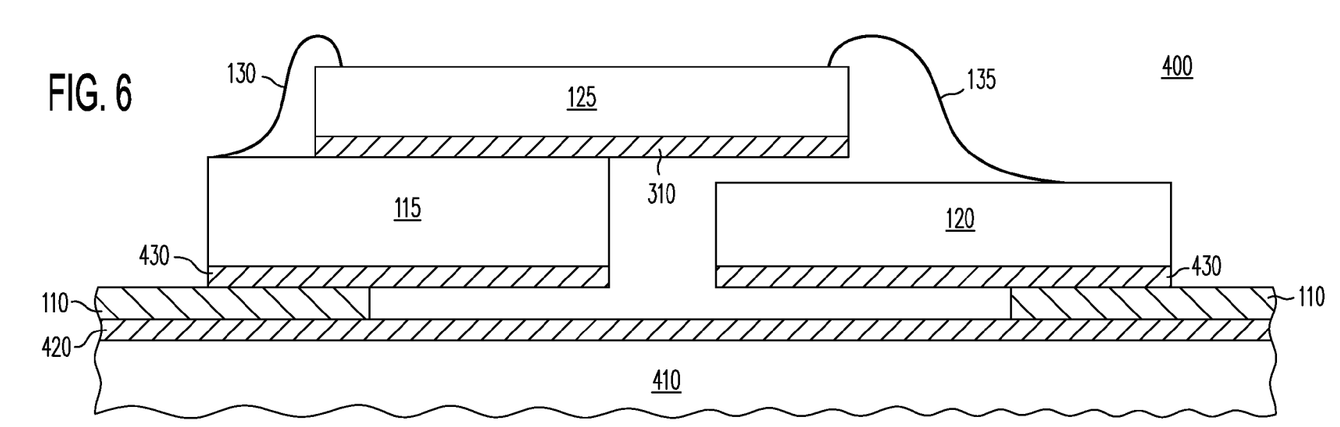

FIG. 6 is a simplified block diagram illustrating the cross-sectional view of device structure 400 at a later stage in the processing example. Wire bonds 130 and 135 are formed from contact pads on the active surface of controller die 125 to contact pads on the active surfaces of the MEMS device die. Wire bonds 130 and 135 can be formed using a variety of techniques known in the art, and can include using gold or copper to form the wire bond, as appropriate to the application. While using copper for wire bonding can be less expensive than using gold, forces used in standard techniques to form copper wire bonds may be too high to maintain adhesive coupling between MEMS device die 115 and controller die 125 when forming wire bond 135 over the cantilevered section. In some embodiments, the cantilevered section can extend as much as 1 mm from the edge of MEMS device die 115 to the end of controller die 125. In cases where the standard technique forces for copper wire bonds are too high, either gold wire bonds can be used for electronic coupling, or modified copper wire bonding techniques will be indicated to reduce forces on the cantilevered contact pads. Such modified wire bonding techniques can include lower force and higher ultrasonic vibration in formation of the wire bond.

Figure 7:
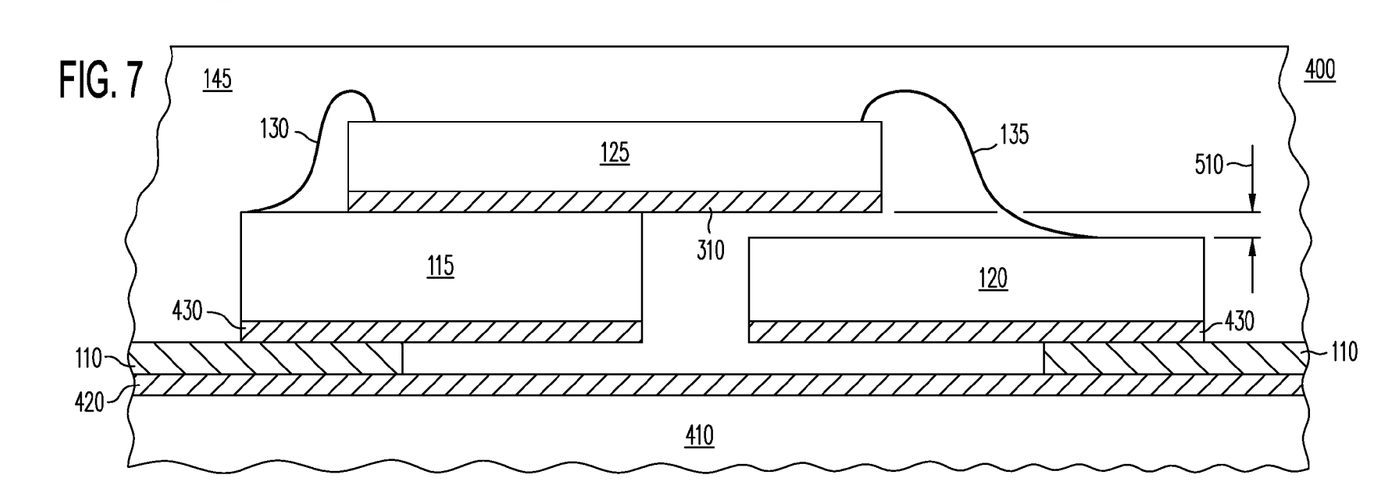

FIG. 7 is a simplified block diagram illustrating the cross-sectional view of device structure 400 at a later stage in the processing example. A molding compound is applied to the structures affixed to carrier 410 (e.g., MEMS device die 115 and 120, controller die 125, and wire bonds 130 and 135, forming an encapsulant 145 that encapsulates the structures within the molding material and forms a panel. As discussed above, the molding material can be any appropriate encapsulant to the application. In order for the molding material to fill the gaps between the MEMS device die and between the cantilevered portion of controller die 125 and MEMS device die 120, a preferred method for applying the molding material is pressure molding using vacuum techniques to draw the molding material into the gap regions. Once the molding material is applied, the panel can be cured by exposing the materials to certain temperatures for a period of time, or by applying curing agents, or both. After curing, the panel can be separated from carrier 410 by releasing adhesive layer 420, and the individual semiconductor device packages can be singulated.

Embodiments of the present invention provide for a small footprint, low thickness semiconductor device package containing multiple MEMS sensor devices along with a controller die. The small footprint is accomplished by providing the controller die over the semiconductor device die in a stacked configuration. Depending upon the application, the controller die can be affixed to one or multiple MEMS sensor die in the package. One application parameter that can contribute to a determination of controller die stacking configuration is the heat variations the package will experience during operation, as these will result in stresses within the package due to differing coefficients of thermal expansion between the various package materials and semiconductor device die. Another consideration is whether the molding material selected for the application can effectively fill gaps between the various encapsulated die so as to avoid voids and significant material differences (e.g., high resin content and the like).

By now it should be appreciated that there has been provided a semiconductor device package that includes a first and second semiconductor device die and a controller die. A first major surface of the controller die is mechanically coupled to an active major surface of the first semiconductor device die. The first major surface of the controller die extends over an active major surface of the second semiconductor device die. A first set of wire bonds couples a first set of contact pads of the controller die to contact pads of the first semiconductor device die. A second set of wire bonds couples a second set of contact pads of the controller die to contact pads of the second semiconductor device die.

In one aspect of the above embodiment, the semiconductor device package further includes encapsulant over, under, and around the first and second semiconductor device die and the controller die. The encapsulant forms an encapsulated region of the semiconductor device package.

In another aspect of the above embodiment, the first and second semiconductor device die are configured with side surfaces that are approximately in parallel, and which define a gap region between the side surfaces. The encapsulant is formed in the gap region. In a further aspect, the second semiconductor device die has a same thickness as the first semiconductor device die and the first major surface of the controller die is mechanically coupled to the active major surface of the second device die and forms a bridge over the gap region. In another further aspect, the second semiconductor device die has a thickness less than that of the first semiconductor device die, and the extent of the controller die over the second semiconductor device die forms a vertical space region between the first major surface of the controller die and the active major surface of the second semiconductor device die. In a still further aspect, the encapsulant is formed in the vertical space region between the first major surface of the controller die and the active major surface of the second semiconductor device die.

In another aspect of the above embodiment, the first and second semiconductor device die are MEMS device die that are sensor devices. In a further aspect, the sensor device is one of a gyroscope, an accelerometer, or a magnetometer, and the first and second semiconductor device die are distinct sensor device types from one another. In still a further aspect, the first and second semiconductor device die are configured such that operational axes of the associated sensor devices are in a known relationship to one another.

Another aspect of the above embodiment includes one or more leads provided by a lead frame, and a third set of wire bonds coupling a third set of contact pads of the controller die to corresponding leads of the one or more leads.

Another embodiment provides a method for packaging an electronic device assembly. The method includes providing a carrier, placing a lead frame on the carrier in an area that includes an area for the electronic device assembly, placing a first semiconductor device die on a portion of the lead frame in the area for the electronic device assembly, and placing a second semiconductor device die on another portion of the lead frame in the area for the electronic device assembly. The second semiconductor device die is configured with a side surface substantially in parallel with a side surface of the first semiconductor device die, defining a gap region between the side surfaces. The method further includes mechanically coupling a first major surface of the controller die to an active major surface of the first semiconductor device die, where the first major surface of the controller die extends over an active major surface of the second semiconductor device die, and forming a first set of wire bonds coupling a first set of contact pads of the controller die to contact pads of the second semiconductor device die.

One aspect of the above embodiment further includes forming an encapsulant over, under, and around the first and second semiconductor device die and the controller die. A further aspect includes forming the encapsulant in the gap region. A still further aspect provides for mechanically coupling the first major surface of the controller die to the active major surface of the second semiconductor device die, where the second semiconductor device die has a same thickness as the first semiconductor device die, and the controller die forms a bridge between the first and second semiconductor device die over the gap region. Another further aspect provides for forming an encapsulant in a vertical region between the first major surface of the controller die and the active major surface of the second semiconductor device die, where the second semiconductor device die has a thickness less than that of the first semiconductor device die, and the extent of the controller die over the second semiconductor device die forms the vertical space region.

In another aspect of the above embodiment the first and second semiconductor device die each are MEMS device die that are sensor devices. In a further aspect, the sensor devices can be one of a gyroscope, an accelerometer, or a magnetometer, and the first and second semiconductor device die are distinct sensor device types from one another. Another further aspect orients the operational axes of the associated sensor devices in a known relationship to one another.

Another aspect of the above embodiment includes a lead frame having one or more leads, and coupling a third set of contact pads of the controller die to corresponding leads of the one or more leads using corresponding wire bonds. In a further aspect, forming the wire bonds includes forming wire bonds from one or more of copper and gold.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, embodiments are not restricted to a particular type of MEMS sensor die or controller die. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
   a first semiconductor device die;
   a second semiconductor device die;
   a controller die, wherein
      a first major surface of the controller die is mechanically coupled to an active major surface of the first semiconductor device die,
      the first major surface of the controller die extends over an active major surface of the second semiconductor device die;
   a first set of wire bonds coupling a first set of contact pads of the controller die to contact pads of the first semiconductor device die; and
   a second set of wire bonds coupling a second set of contact pads of the controller die to contact pads of the second semiconductor device die.

2. The semiconductor device package of claim 1 further comprising:
   encapsulant over, under, and around the first semiconductor device die, over, under, and around the second semiconductor device die, and over, under, and around the controller die, wherein the encapsulant forms an encapsulated region of the semiconductor device package.

3. The semiconductor device package of claim 2, wherein
   the first and second semiconductor device die are configured with side surfaces approximately in parallel, defining a gap region between the side surfaces, and
   the encapsulant is formed in the gap region.

4. The semiconductor device package of claim 3, wherein
   the second semiconductor device die has a same thickness as the first semiconductor device die, and
   the first major surface of the controller die is mechanically coupled to the active major surface of the second device die and forms a bridge over the gap region.

5. The semiconductor device package of claim 3, wherein
   the second semiconductor device die has a thickness less than the first semiconductor device die, and
   the extent of the controller die over the second semiconductor device die forms a vertical space region between the first major surface of the controller die and the active major surface of the second semiconductor device die.

6. The semiconductor device package of claim 5, wherein the encapsulant is formed in the vertical space region between the first major surface of the controller die and the active major surface of the second semiconductor device die.

7. The semiconductor device package of claim 1 wherein the first and second semiconductor device die each comprise a microelectromechanical systems (MEMS) device die that is a sensor device.

8. The semiconductor device package of claim 7, wherein
   the sensor device comprises one of a gyroscope, an accelerometer, or a magnetometer, and
   the first and second semiconductor device die comprise distinct sensor device types from one another.

9. The semiconductor device package of claim 8, wherein
   the first and second semiconductor device die are configured such that operational axes of the associated sensor devices of the first and second semiconductor device die are in a known relationship to one another.

10. The semiconductor device package of claim 1 further comprising:
    one or more leads provided by a lead frame; and
    a third set of wire bonds coupling a third set of contact pads of the controller die to corresponding leads of the one or more leads.

11. A method for packaging an electronic device assembly, the method comprising:
    providing a carrier;
    placing a lead frame on the carrier in an area that comprises an area for the electronic device assembly;
    placing a first semiconductor device die on a portion of the lead frame in the area for the electronic device assembly;
    placing a second semiconductor device die on another portion of the lead frame in the area for the electronic device assembly, wherein the second semiconductor device die is configured with a side surface substantially in parallel with a side surface of the first semiconductor device die, defining a gap region between the side surfaces;

mechanically coupling a first major surface of a controller die to an active major surface of the first semiconductor device die, wherein the first major surface of the controller die extends over an active major surface of the second semiconductor device die; and forming a first set of wire bonds coupling a first set of contact pads of the controller die to contact pads of the second semiconductor device die.

12. The method of claim 11 further comprising:

forming an encapsulant over, under, and around the first semiconductor device die, over, under, and around the second semiconductor device die, and over, under, and around the controller die.

13. The method of claim 12 further comprising:

forming the encapsulant in the gap region.

14. The method of claim 13 further comprising:

mechanically coupling the first major surface of the controller die to the active major surface of the second semiconductor device die, wherein the second semiconductor device die has a same thickness as the first semiconductor device die, and the controller die forms a bridge between the first and second semiconductor device die over the gap region.

15. The method of claim 13 further comprising:

forming encapsulant in a vertical space region between the first major surface of the controller die and the active major surface of the second semiconductor device die, wherein the second semiconductor device die has a thickness less than the first semiconductor device die, and the extent of the controller die over the second semiconductor device die forms the vertical space region.

16. The method of claim 11 wherein the first and second semiconductor device die each comprise a microelectromechanical systems (MEMS) device that is a sensor device.

17. The method of claim 16, wherein the sensor device comprises one of a gyroscope, an accelerometer, or a magnetometer, and the first and second semiconductor device die comprise distinct sensor device types from one another.

18. The method of claim 17 further comprising:

orienting the operational axes of the associated sensor devices of the first and second semiconductor device die in a known relationship to one another.

19. The method of claim 11, wherein the lead frame has one or more leads, and the method further comprises:

coupling a third set of contact pads of the controller die to corresponding leads of the one or more leads, using corresponding wire bonds.

20. The method of claim 19, wherein said forming said wire bonds comprises forming wire bonds from one or more of copper and gold.

* * * * *